United States Patent
Chandra et al.

(10) Patent No.: US 8,363,484 B2
(45) Date of Patent: Jan. 29, 2013

(54) MEMORY DEVICE AND METHOD OF CONTROLLING A WRITE OPERATION WITHIN A MEMORY DEVICE

(75) Inventors: Vikas Chandra, Fremont, CA (US); Daeyeon Kim, Ann Arbor, MI (US)

(73) Assignee: ARM Limited, Cambridge (GB)

( * ) Notice: Subject to any disclaimer, the term of this patent is extended or adjusted under 35 U.S.C. 154(b) by 141 days.

(21) Appl. No.: 13/064,189

(22) Filed: Mar. 9, 2011

(65) Prior Publication Data
US 2012/0230122 A1 Sep. 13, 2012

(51) Int. Cl.
*G11C 7/10* (2006.01)
(52) U.S. Cl. ......... 365/189.04; 365/189.07; 365/189.11; 365/189.15; 365/189.16
(58) Field of Classification Search ............. 365/189.04, 365/189.07, 189.11, 189.15, 189.16
See application file for complete search history.

(56) References Cited

U.S. PATENT DOCUMENTS

| | | | | |
|---|---|---|---|---|
| 5,983,375 | A * | 11/1999 | Kim et al. | 714/720 |
| 6,208,544 | B1 * | 3/2001 | Beadle et al. | 365/49.1 |
| 6,452,844 | B2 * | 9/2002 | Koshikawa | 365/200 |

OTHER PUBLICATIONS

Toh, Seng oon et al., "Dynamic SRAM Stability Characterization in 45nm CMOS", University of California, Dept. of Elec. Engineering and Computer Sciences, 2 pages, Dec. 2008.

Aitken, Robert et al., "Worst-Case Design and Margin for Embedded SRAM", ARM, (2007), pp. 1289-1294, Feb. 4, 2007.

Chandra, Vikas et al., "On the Efficacy of Write-Assist Techniques in Low Voltage Nanoscale SRAMs", ARM, (2010), pp. 345-350, Jun. 2, 2010.

Seok, Mingoo et al., "The Phoenix Processor: A 30pW Platform for Sensor Applications", 2008 Symposium on VLSI Circuits Digest of Technical Papers, (2008), pp. 188-189, Mar. 8, 2008.

* cited by examiner

*Primary Examiner* — Pho M Luu
(74) *Attorney, Agent, or Firm* — Nixon & Vanderhye P.C.

(57) ABSTRACT

A memory device and method are provided incorporating a technique for controlling a write operation within the memory device. The memory device has an array of memory cells, each memory cell supporting writing and simultaneous reading of that memory cell. Write circuitry is arranged, during a write operation, to provide write data to a number of addressed memory cells within the array, whilst word line select circuitry is responsive to the start of the write operation to assert a write word line signal that enables those addressed memory cells to store the write data. Comparing circuitry is arranged, during the write operation, to compare the write data with data currently stored in the addressed memory cells. On detecting that the write data matches the data currently stored in the addressed memory cells, the comparing circuitry asserts a control signal to the word line select circuitry to cause the word line select circuitry to de-assert the write word line signal. As a result, the pulse width of the asserted write word line signal is dependent on time taken by the addressed memory cells to store the write data, thereby leading to a significant reduction in the size of the pulse width when compared with known prior art techniques.

10 Claims, 6 Drawing Sheets

MEMORY DEVICE AND METHOD OF CONTROLLING A WRITE OPERATION WITHIN A MEMORY DEVICE

BACKGROUND OF THE INVENTION

1. Field of the Invention

The present invention relates to a memory device, and method of operation of such a device, and in particular to techniques for controlling a write operation within a memory device.

2. Description of the Prior Art

As process geometries shrink in modern data processing systems, the variability in the operating characteristics of the individual circuit elements increases. Considering as an example a memory device consisting of an array of memory cells, it will be understood that each memory cell will typically consist of a number of electronic components such as transistors, and the variability in those individual components significantly increases as process geometries shrink. To ensure correct operation of the memory device, it is necessary to control the operation of the memory device having regards to the worst case characteristics of the memory cells within the device.

Furthermore, there is an increasing desire to operate data processing systems at lower and lower supply voltages, and as the supply voltage decreases, reliability issues due to the variations in the individual components become more prominent.

Considering the steps required to perform a write operation to a number of memory cells within a memory device, this typically involves asserting a write word line signal to the appropriate row of the memory array so as to enable the addressed memory cells in that row, such that they can then store the required write data in accordance with values provided on their bit lines. The write word line signal is typically provided as a pulse, with the width of that pulse being set having regards to the worst case memory cell within the device, i.e. the width of the pulse has to be long enough that the memory cell in the device which takes the longest to store write data has sufficient time to correctly store the write data.

It is known to use techniques such as dynamic noise margin techniques in order to characterise the stability of cells within a memory device, and as a result of that characterisation to determine an appropriate write word line pulse width that will take account of the worst case cell within the device. For example, the article "Dynamic SRAM Stability Characterization in 45 nm CMOS" by S Toh et al, 2010 Symposium on VLSI Circuits, describes the use of a dynamic noise margin method that uses critical word line pulse width to estimate SRAM cell stability more precisely. However, it is still complicated to determine the appropriate word line pulse width to use for any particular memory device. During a write operation of a memory device such as an SRAM memory, if a write word line pulse width is set not long enough, this will cause write failures within the memory device, whilst if the write word line pulse width is too long, this will limit the operation frequency of the memory device. In general, a sufficient design margin is required to overcome the worst case scenario, as discussed for example in the article "Worst-Case Design and Margin for Embedded SRAM" by R Aitken et al, 2007 Design, Automation and Test in Europe.

However, as discussed above, technology scaling and/or supply voltage reduction that is prevalent in many modern day systems, leads to a requirement for the margin to be made larger and larger. As a result, such larger margins have a very significant impact on performance, and in turn are becoming one of the most challenging issues in the future design of memory devices.

One known technique for seeking to reduce variation and increase operating speed is referred to as word line boosting, described for example in the article "On the Efficacy of Write-Assist Techniques in Low Voltage Nanoscale SRAMs" by V Chandra et al, 2010 Design, Automation and Test in Europe. By increasing word line voltage, the access transistors of the memory cells are overdriven, causing the memory cells to be written more strongly, and as a result increasing operating speed and reducing margin. However, in modern memory devices, it is often the case that not all of the memory cells connected to a particular word line are actually being written in any particular clock cycle, those memory cells not being written being referred to as half selected memory cells. If the word line voltage is increased, this increases the possibility that during the write operation the data in these half selected cells is corrupted (i.e. caused to flip state). Hence, whilst the word line boosting approach can increase operating speed and reduce the margin required for the write word line pulse width, it can cause data corruption in half selected cells, and accordingly the amount of word line boosting has to be carefully managed. Further, over time, the exposure of the word lines to an increased voltage can give rise to various reliability problems within the memory device.

Accordingly, it would be desirable to provide an improved technique for performing write operations on addressed memory cells within a memory device, that would enable a reduction in the write word line pulse width margin.

SUMMARY OF THE INVENTION

Viewed from a first aspect, the present invention provides a memory device comprising: an array of memory cells, each memory cell being configured to support writing and simultaneous reading of that memory cell; write circuitry configured, during a write operation, to provide write data to a number of addressed memory cells within the array; word line select circuitry, responsive to a start of the write operation, to assert a write word line signal to enable said number of addressed memory cells to store said write data; and comparing circuitry configured, during the write operation, to compare said write data with data currently stored in said number of addressed memory cells; the comparing circuitry being responsive to detecting that said write data matches the data currently stored in said number of addressed memory cells, to assert a control signal to the word line select circuitry to cause the word line select circuitry to de-assert said write word line signal; whereby a pulse width of the asserted write word line signal is dependent on time taken by the number of addressed memory cells to store said write data.

In accordance with the present invention, the pulse width of the asserted write word line signal is varied adaptively in situ, having regard to the actual time taken to store write data into the addressed memory cells for each individual write operation. In particular, comparing circuitry is arranged during the course of the write operation to compare the write data that is being written into the addressed memory cells with the data that is actually currently stored in those addressed memory cells. As soon as the comparing circuitry detects that the write data matches the data currently stored in the addressed memory cells, this indicates that the write process has completed, and accordingly the comparing circuitry then causes the word line select circuitry to de-assert the write word line signal. Accordingly, the pulse width of the asserted write word line signal is set just long enough to complete the write operation in respect of the actual memory cells being addressed. This hence results in a significant reduction in the pulse width when compared with prior art techniques which have to set the pulse width having regards to the worst case cell in the entire memory device. In addition, the ability to keep the pulse width as short as possible having regards to the actual addressed memory cells reduces the earlier-mentioned half select problem, since in designs of memory device where other non-addressed memory cells may also be subjected to the asserted write word line signal, the fact that the write word line signal is only asserted for as long as necessary to ensure that the write data is written also reduces the prospect that those non-addressed memory cells could become corrupted.

The inventors of the present invention are aware of the article "The Phoenix Processor: a 30 pW platform for sensor applications" by M Seok et al, 2008 Symposium on VSLI Circuits, pages 188 and 189, which describes a custom designed fourteen transistor SRAM cell which has extremely slow high threshold voltage devices, and which allows a write operation to be performed asynchronously by those slow devices. Write completion is determined by reading the contents of the row being written and comparing it to the write data. However, this comparison is done to check whether the asynchronous write operation has completed, and is not used to create any feedback to the word line select circuitry. In particular, the technique described in that article does not alter the pulse width of the asserted write word line signal based on a control signal asserted by the comparing circuitry.

There are a number of ways in which the comparing circuitry can monitor the data currently stored in the addressed memory cells in order to determine whether that data matches the write data. In one embodiment, following assertion of the write word line signal by the word line select circuitry, the comparing circuitry implements an iterative comparison operation, each iteration of the comparison operation comprising a read stage where the data currently stored in said number of addressed memory cells is read, followed by an evaluation stage where said write data is compared with the data obtained by the read stage. Hence, in such embodiments, the comparison operation is repeated iteratively until a match is detected, at which point the control signal is asserted and the write word line signal is de-asserted.

There are a number of ways in which the data currently stored in the addressed memory cells can be read. However, in one embodiment, during said read stage, voltage on a read bit line associated with each addressed memory cell is monitored in order to determine the data currently stored in that addressed memory cell, and each iteration of the comparison operation includes a precharge stage prior to said read stage where each read bit line associated with said number of addressed memory cells is precharged to a predetermined voltage level. In one embodiment, during each precharge stage, the read bit lines are precharged to a predetermined voltage level corresponding to a logic one level, but it will be appreciated that in an alternative embodiment, through appropriate configuration of the circuits, the read bit lines could be precharged to a voltage level associated with a logic zero level.

Whilst in one embodiment the comparison operation can be repeated iteratively for an indefinite period until the write operation has completed, in one embodiment the memory device further comprises timeout circuitry which is responsive to the comparing circuitry not asserting the control signal by a predetermined time after the write word line signal was asserted by the word line select circuitry, to terminate the write operation. Accordingly, in the event that at least one of the addressed memory cells is unable to complete the write operation for some reason, the operation of the timeout circuitry ensures that the write operation is terminated after a predetermined time has elapsed without the write data having been written into the addressed memory cells.

In principle, a single memory cell can be addressed by a write operation. However, in one embodiment, the number of addressed memory cells comprises a plurality of addressed memory cells, each addressed memory cell being configured during the write operation to store a corresponding bit of a data word forming the write data.

In one such embodiment, the comparing circuitry comprises a comparison block associated with each addressed memory cell, and an evaluation block configured to only assert the control signal to the word line select circuitry if each comparison block detects a match between the data bit currently stored in the associated addressed memory cell and the corresponding bit of the data word forming the write data.

The various comparison blocks and evaluation block may be interconnected in a variety of ways. However, in one embodiment where the comparing circuitry implements an iterative comparison operation, the evaluation block is coupled to a signal line which, for each comparison operation, is precharged to a first voltage level. During each comparison operation, each comparison block is arranged, once the signal line has been precharged, to alter the voltage on said signal line if a match is not detected between the data bit currently stored in the associated addressed memory cell and the corresponding bit of the data word forming said write data, whereafter the evaluation block asserts the control signal if the voltage on the signal line has not been altered.

In one particular embodiment, the signal line is precharged to a logic one level, and each comparison block is arranged to discharge the voltage on the signal line if a match is not detected between the data bit currently stored in the associated addressed memory cell and the corresponding bit of the data word forming the write data. Accordingly, it will be understood that during each iteration of the comparison operation, the signal line will be discharged unless all of the addressed memory cells have correctly stored the associated bit of the write data. The comparison operation is then repeated until the evaluation block observes that the voltage on the signal line has not been altered during the operation of the comparison blocks, at which point the control signal is asserted. This provides a particularly simple and effective technique for implementing the required functions of the comparing circuitry.

Viewed from a second aspect, the present invention provides a method of controlling a write operation within a memory device having an array of memory cells, each memory cell being configured to support writing and simultaneous reading of that memory cell, the method comprising: during a write operation, providing write data to a number of addressed memory cells within the array; responsive to a start of the write operation, asserting a write word line signal to enable said number of addressed memory cells to store said write data; during the write operation, comparing said write data with data currently stored in said number of addressed memory cells; and responsive to detecting that said write data matches the data currently stored in said number of addressed memory cells, asserting a control signal to cause said write word line signal to be de-asserted; whereby a pulse width of the asserted write word line signal is dependent on time taken by the number of addressed memory cells to store said write data.

Viewed from a third aspect, the present invention provides a memory device comprising: an array of memory cell means, each memory cell means for supporting writing and simultaneous reading of that memory cell means; write means for providing, during a write operation, write data to a number of addressed memory cell means within the array; word line select means for asserting a write word line signal in response to a start of the write operation, the write word line signal enabling said number of addressed memory cell means to store said write data; and comparing means for comparing, during the write operation, said write data with data currently stored in said number of addressed memory cell means; the comparing means, in response to detecting that said write data matches the data currently stored in said number of addressed memory cell means, for asserting a control signal to the word line select means to cause the word line select means to de-assert said write word line signal; whereby a pulse width of the asserted write word line signal is dependent on time taken by the number of addressed memory cell means to store said write data.

BRIEF DESCRIPTION OF THE DRAWINGS

The present invention will be described further, by way of example only, with reference to embodiments thereof as illustrated in the accompanying drawings, in which.

DESCRIPTION OF EMBODIMENTS

Figure 1:
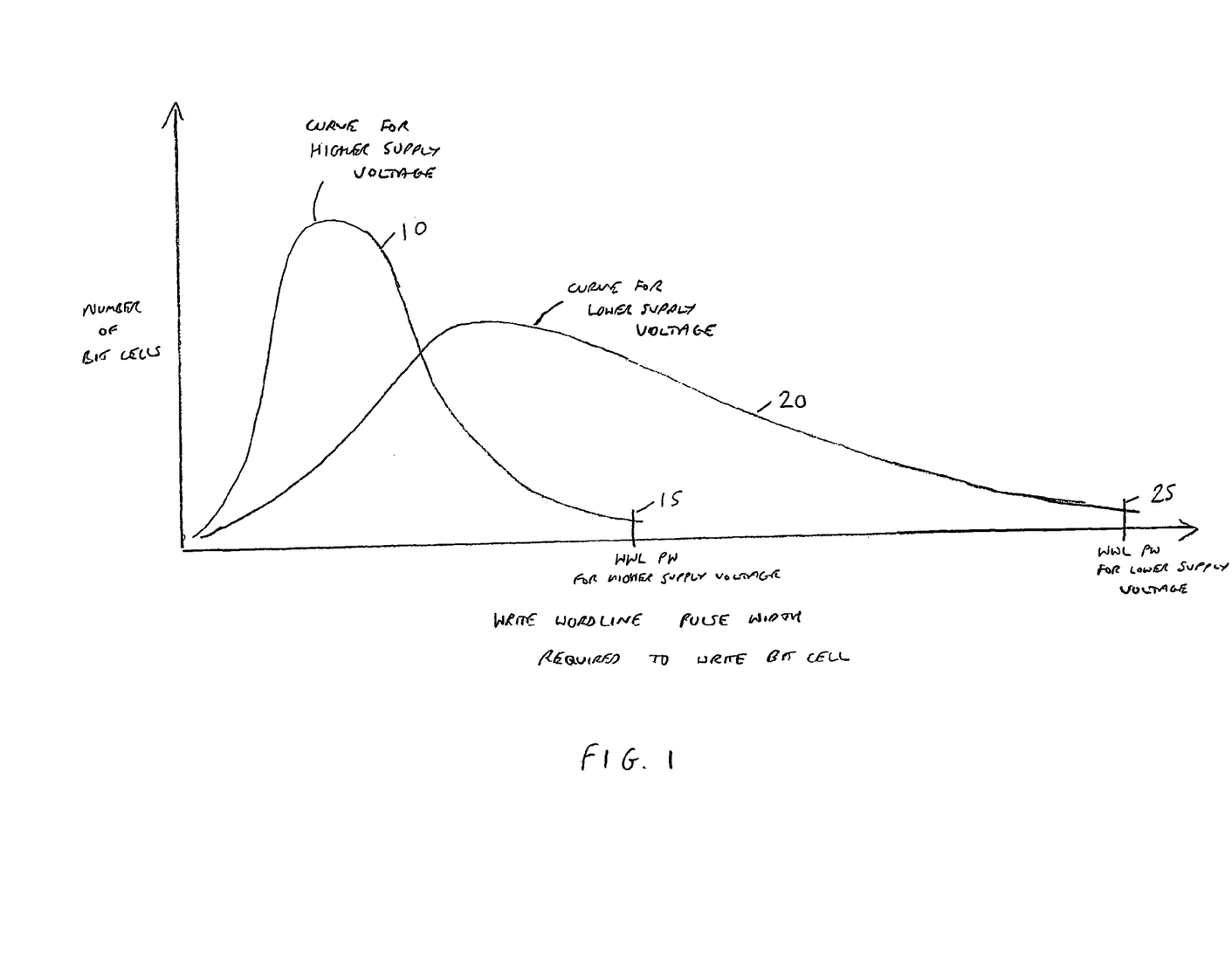
FIG. 1 is a graph schematically illustrating how the variability in the write time of bit cells increases as the supply voltage is decreased.

As mentioned earlier, as process geometries shrink, the variation between the various memory cells of a memory device increases. In accordance with prior art schemes, this has typically led to a requirement to increase the pulse width of the write word line signal when performing the write operation. Furthermore, even at a particular process geometry, as the supply voltage is reduced, the variation in the cells has a more prominent effect, and in particular leads to a much wider distribution in the required pulse width of the write word line signal required to ensure correct operation of the memory cells during a write operation. This is illustrated schematically in FIG. 1, which shows how the profile of the required write word line pulse width varies dependent on whether a higher supply voltage is used (curve 10) or a lower supply voltage is used (curve 20). Typically it is required to set the pulse width of the write word line select signal having regards to a worst case, and accordingly it can be seen that whilst a value 15 may be sufficient when a higher supply voltage is used, a significantly larger value 25 may be needed when a lower supply voltage is used. Indeed, by way of example, considering 20 nm CMOS technology, a 2.1× margin may be required for a successful write at 1.0V, whilst a 26.5× margin may be necessary when the supply voltage is reduced to 0.6V. After taking account of nominal speed degradation that occurs as the supply voltage is reduced (which by way of example may be 6.3×), this can mean that the total operation speed is lowered by 80.5× when the supply voltage is reduced from 1.0V to 0.6V. This is clearly very undesirable.

The embodiments described hereafter seek to reduce this performance penalty by avoiding the need to set the pulse width of the write word line having regards to the worst case cell within the entire memory device. This is based on a realisation that for any particular write operation, the entire array will not be written to, but instead a plurality of memory cells within a particular word line will be addressed by any particular write operation, so as to store a word of write data (for example 8, 16 or 32 bits) into those addressed memory cells. Based on this observation, the embodiments described herein seek to adapt the pulse width in situ for each write operation, having regards to the addressed memory cells. The technique of the described embodiments can be used in any memory device where the individual memory cells of the memory array can be written to and simultaneously read from. A number of such memory cell designs currently exist, one example being the 8T SRAM cell, which is illustrated in FIG. 2.

Figure 2:
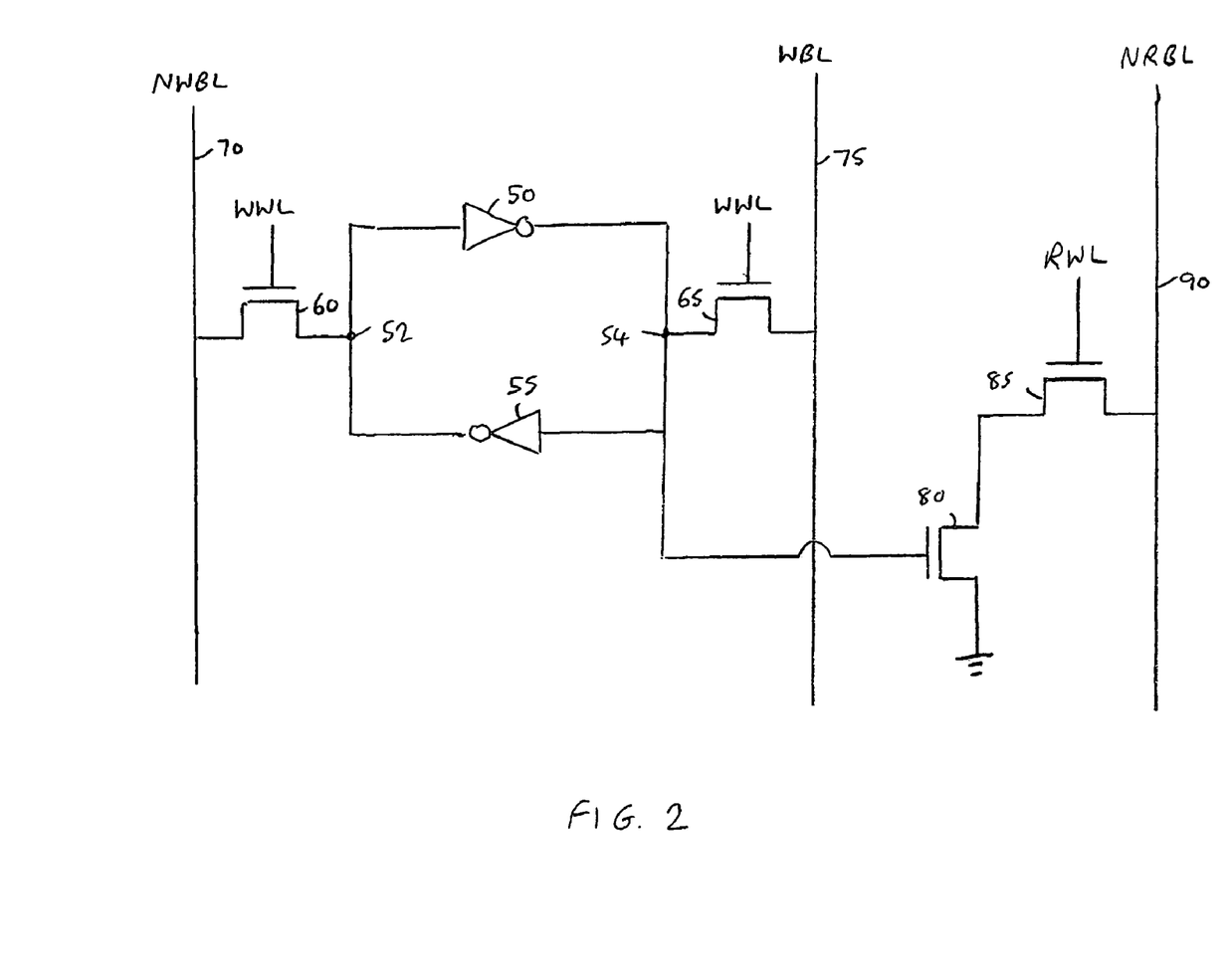
FIG. 2 schematically illustrates an 8T SRAM cell used in one embodiment.

As shown in FIG. 2, a latch formed of the two inverters 50, 55 is used to store a single bit data value. In particular, during a write operation, one of the write bit lines 70, 75 will be driven to a logic one value whilst the other write bit line will be driven to a logic zero value. At the same time, a write word line pulse will be provided to the access transistors 60, 65 to turn those transistors on and thereby connect the write bit lines to the latch. This will cause the nodes 52, 54 to be driven to opposite logic levels to thereby encode either a logic zero value or a logic one value within the latch, dependent on the values on the bit lines 70, 75. At the end of the write operation, the pulse provided to the access transistor 60, 65 will be de-asserted, whereafter the written value will be retained within the latch.

In addition, a series of transistors 80, 85 are connected to a write bit line 90. When it is desired to read the cell, a read word line pulse is provided to the transistor 85 to turn that transistor on. At this point, the read bit line 90 will typically have been precharged to a logic one value and will now be placed into a floating condition. As a result, that read bit line will either remain at the logic one level or start to discharge, dependent on whether the transistor 80 is turned on, this in turn depending on the value stored within the latch formed by the inverters 50, 55. This read operation can be performed simultaneously with the write operation, and at the end of the read operation, the value of the bit line 90 can be assessed in order to determine what value is stored within the bit cell.

Figure 3:
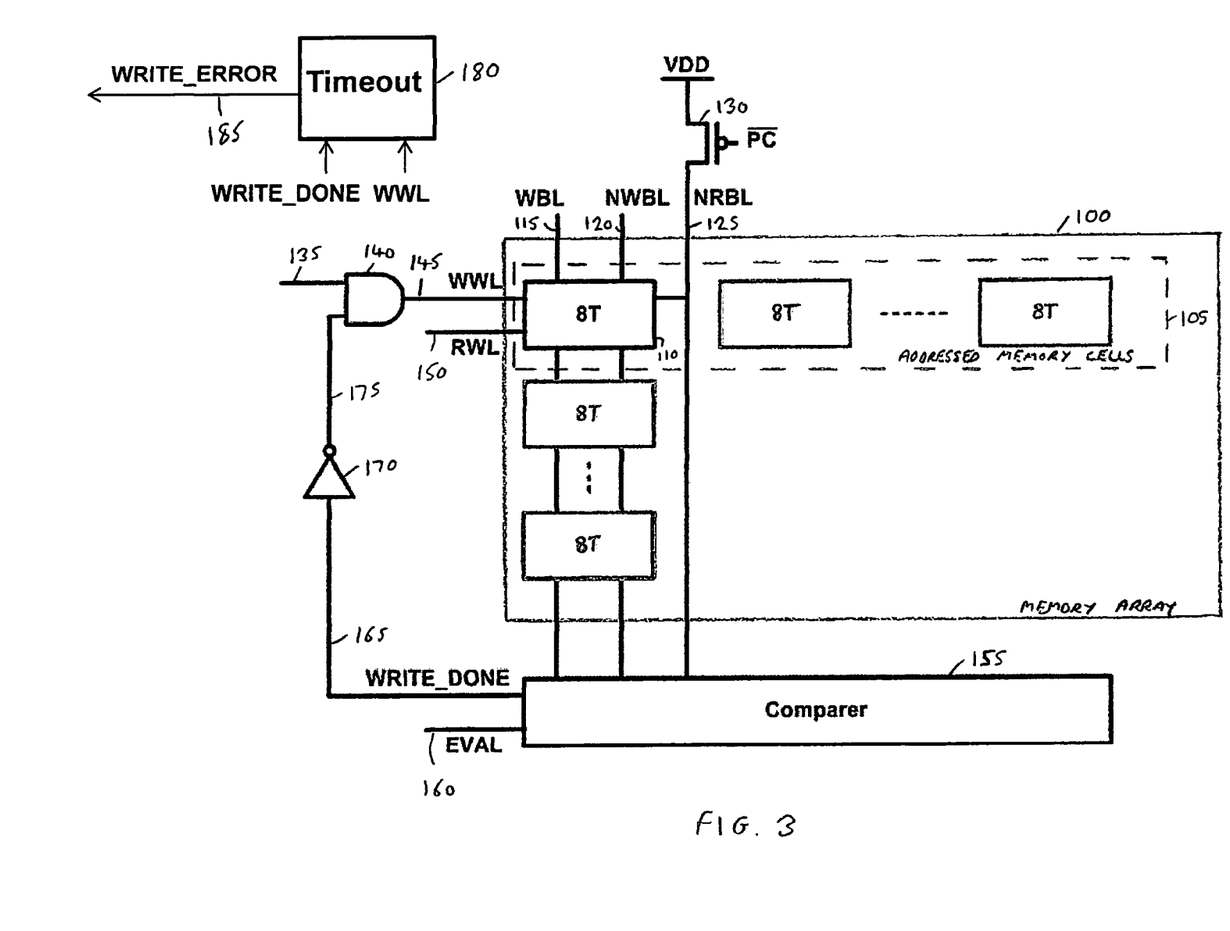
FIG. 3 illustrates components provided within a memory device in accordance with one embodiment.

In accordance with one embodiment, a memory device is provided as shown in FIG. 3, that memory device including a memory array 100 consisting of an array of such 8T SRAM cells. As shown schematically for the memory cell 110, the two write bit lines 115, 120 connect to all the cells in a particular column, as does the read bit line 125. A write word line signal is provided over path 145 from an AND gate 140. At the start of a write operation, a write done signal output over path 165 by the comparer circuitry 155 will be at a logic zero level, causing the inverter 170 to provide over path 175 a logic one value to the AND gate 140. Accordingly, at this point, if a write word line pulse is asserted over path 135, it will be passed by the AND gate 140 over the path 145 to all of the addressed memory cells 105 within a particular row of the memory array. As also shown in FIG. 3, a read word line signal is provided over path 150.

As will be described in more detail later with reference to the remaining figures, the comparer circuitry 155 is arranged during a write operation to receive the values on the two write bit lines 115, 120 of each addressed memory cell, these values indicating the data to be written into the addressed memory cells, and is also arranged to receive the value on the read bit line 125 for each addressed memory cell, which during a read stage will identify the current contents of the addressed memory cells. An evaluation signal 160 is provided to the comparer circuitry 155, which when asserted causes the comparer circuitry 155 to determine whether the write data matches the currently stored contents of the addressed memory cells. If this is not the case, the write done signal output by the comparer circuitry remains at a logic low level. However, as soon as it is determined that the write data and the current contents of the addressed memory cells match, then the write done signal transitions to a logic one level, which causes a logic zero value to be input to the lower input of the AND gate 140 from the inverter 170, thereby causing the write word line pulse to be de-asserted over path 145. At this point, the write operation terminates.

Accordingly, it will be appreciated that by such a technique the pulse width of the asserted write word line signal over path 145 is dependent on the time taken by the actual addressed memory cells to store the write data, and is only kept asserted for as long as necessary to ensure that the write data is written into those addressed memory cells.

As will be discussed in more detail later, the comparer 155 is arranged to iteratively perform a comparison operation, each comparison operation starting with the read bit line 125 being precharged via the transistor 130 being turned on. Thereafter, the transistor 130 is turned off to cause the read bit line to float, and the read word line is asserted over path 150 to cause the current contents of the addressed memory cells to be read. Thereafter, an evaluate stage is used within the comparer 155 to determine whether the value read matches the value to be written, for each addressed memory cell. Only if the current bit read from each addressed memory cell matches the write data bit to be written into each addressed memory cell is the write done signal asserted over path 165.

Figure 4:
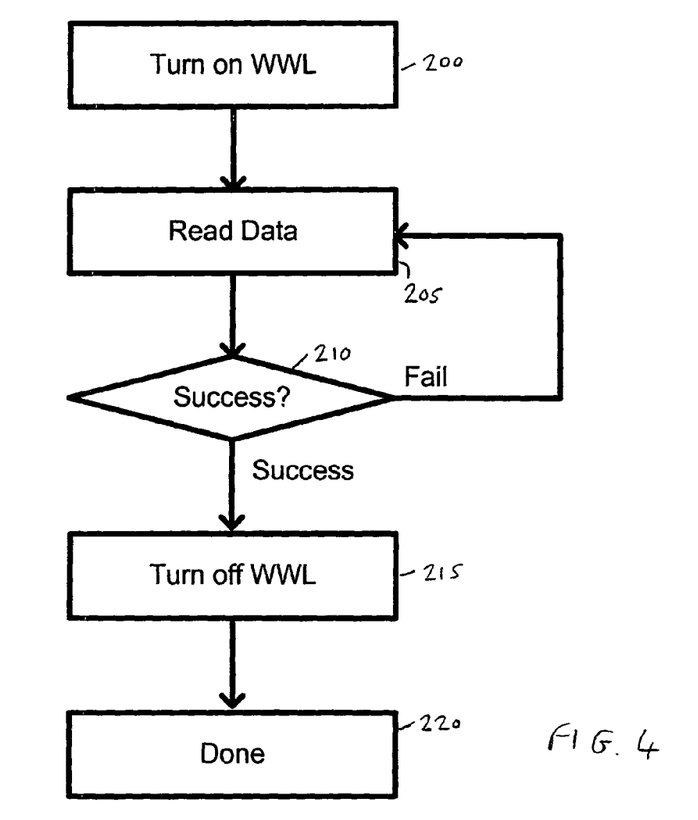
FIG. 4 is a flow diagram illustrating how a write operation is performed using the circuitry of FIG. 3 in accordance with one embodiment.

The operation of the circuitry of FIG. 3 when performing the write operation is schematically illustrated by the flow diagram of FIG. 4. At step 200, the write word line is turned on (i.e. asserted) over path 145, this starting the write operation. Thereafter, the current contents of each addressed memory cell are read at step 205, whereafter it is determined at step 210 whether the current content of each addressed memory cell matches the data to be written into that memory cell. Only if all of the addressed memory cells have their current contents matching the associated write data is it determined that the write operation has completed, and hence a success condition has been determined. In the absence of the success condition, the process returns to step 205 to re-read the data. Once the success condition has been determined, the write done signal is asserted by the comparer 155 to cause the write word line pulse to be turned off at step 215. Thereafter, the write operation is determined to have completed at step 220.

Whereas traditionally the write word line pulse width is predetermined by pulse generation circuitries having regards to a worst case cell in the memory device, and hence does not depend on the actual SRAM cells being addressed, the above described technique ensures that the write word line pulse width is modulated by the SRAM cells being addressed. In particular, as soon as the data has correctly been written into the addressed memory cells, the write word line pulse is turned off and the write operation finishes. Accordingly, by virtue of this technique, the write word line pulse is adaptively varied in situ, and the pulse width is made just long enough having regard to the worst case cell amongst the addressed memory cells for the write operation. Such an approach removes any unnecessary margin in the setting of the write word line pulse width, thereby significantly increasing performance.

Figure 5:
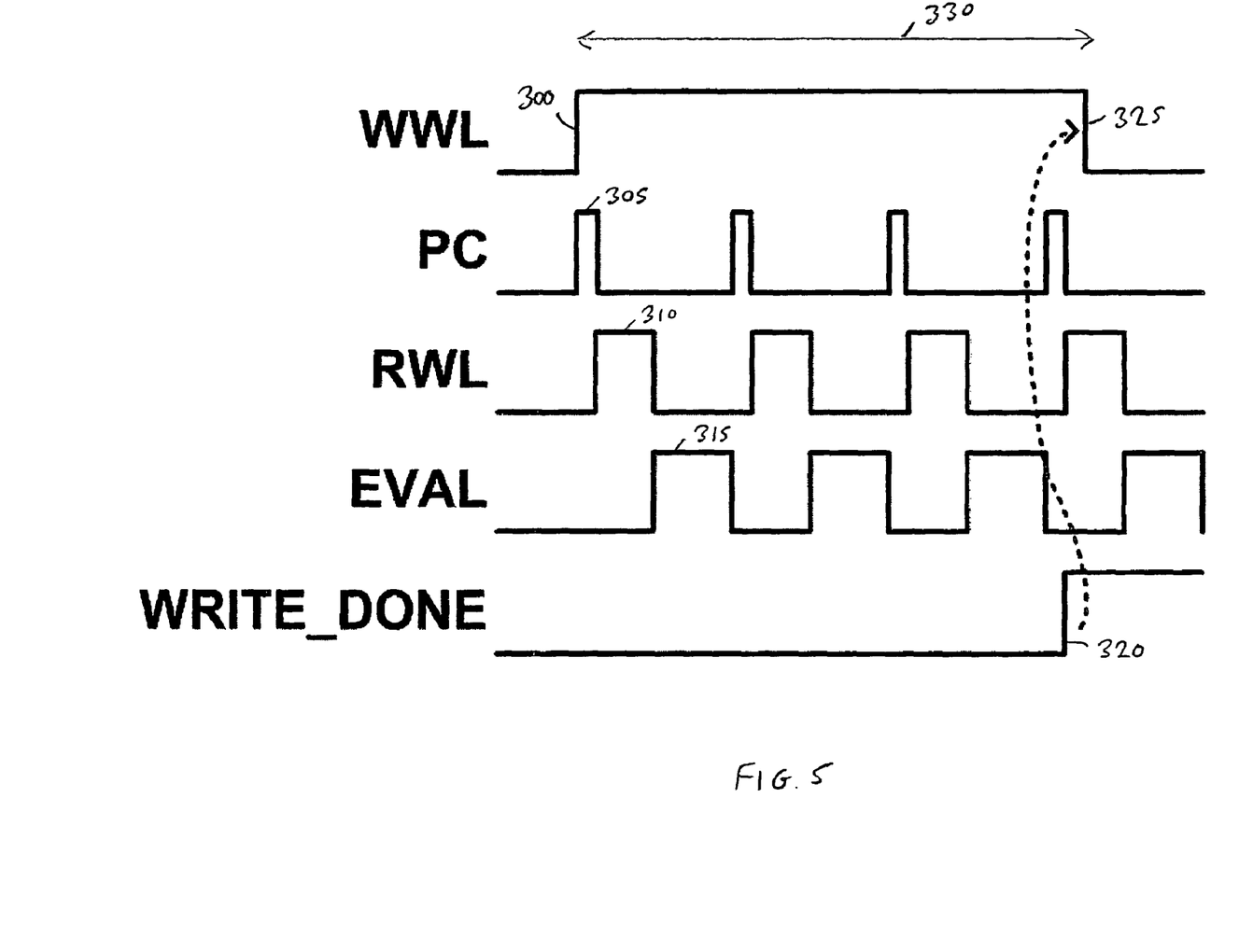
FIG. 5 is a timing diagram illustrating the values of various signals within the circuitry of FIG. 3 during the performance of a write operation in accordance with one embodiment.

FIG. 5 is a timing diagram illustrating the timing of various signals shown in FIG. 3. As shown in FIG. 5, the write word line pulse is asserted at point 300, thereby starting a write operation. Thereafter, the precharge signal is set for a short pulse 305, turning on the transistor 130 and precharging the read bit line 125 to the voltage level Vdd. Thereafter, the precharge pulse is de-asserted and the read word line pulse is asserted to form the pulse 310. During this time, the read bit line 125 will either stay at the supply voltage Vdd or begin to discharge towards a logic zero level, dependent on the current contents of the associated memory cell.

Following de-assertion of the read word line, an evaluate pulse 315 is then asserted to the comparer circuitry 155, to cause the comparer circuitry to determine whether the current content of each addressed memory cell matches the data that is being written into that memory cell. The pulses 305, 310, 315 thereby implement a single iteration of a comparison operation, each iteration of the comparison operation comprising a precharge stage, a read stage and an evaluate stage. If at the end of the comparison operation, it is determined that the read data matches the write data, then the write done signal transitions to a logic 1 level, and causes the write word line to be de-asserted. However, if at the end of the comparison operation, the current contents of the addressed memory cells do not match the write data, then the comparison operation is repeated. In the example of FIG. 5, it is assumed that the comparison operation is repeated three times, and on the third iteration the current contents of the addressed memory cells are determined to match the write data, indicating that the write operation has completed. Accordingly, the write done signal transitions to a logic one level at point 320, causing the write word line to be de-asserted at point 325. Accordingly, it can be seen that the pulse width 330 of the write word line is dynamically adjusted in situ for each write operation, dependent on the time taken by the actual addressed memory cells to correctly store the write data.

Returning to FIG. 3, in one embodiment timeout circuitry 180 is provided which receives the asserted write word line signal on path 145 and also receives the write done signal output by the comparer circuitry 155. In one embodiment, when the write word line signal is asserted (e.g. at point 300 in FIG. 5), the timeout circuitry 180 begins to increment a timer. If that timer reaches a predetermined maximum value without the write done signal having transitioned to a logic one value, then the timeout circuitry 180 issues a write error signal over path 185, causing the write operation to terminate. This avoids the possibility of the write operation continuing indefinitely, and hence ensures that if there is some problem with one of the addressed memory cells causing it to be unable to store the write data, the write operation has a way of terminating.

Figure 6A:
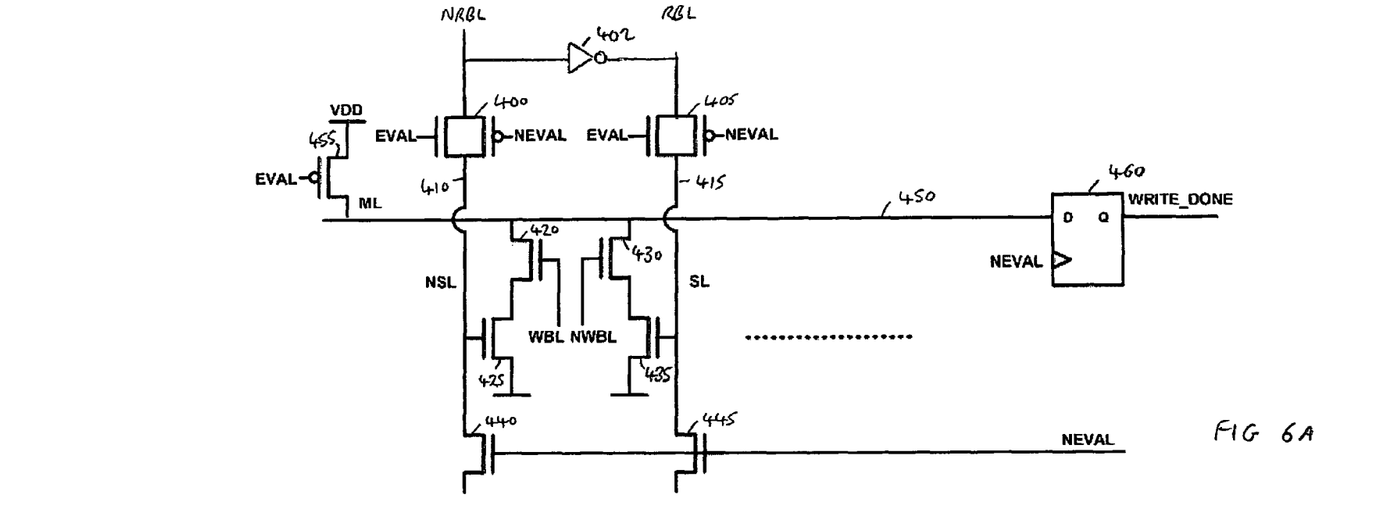
FIG. 6A schematically illustrates the construction of the comparer circuitry of FIG. 3 in accordance with one embodiment.

FIG. 6A schematically illustrates the structure of the comparer circuitry 155 in accordance with one embodiment. An evaluation block 460 in the form of a flip-flop is connected at its input to a signal line 450 which is precharged by the transistor 455 prior to any evaluation taking place. In particular, whilst the evaluate signal of FIG. 5 is at a logic zero level, the signal line 450 is precharged to the supply voltage Vdd. However, as soon as the evaluate signal transitions to a logic one level, the transistor 455 turns off and the signal line 450 can then be discharged dependent on the operation of the components connected to that signal line. In particular, for each addressed memory cell, a comparison block is provided, one such comparison block being illustrated in FIG. 6A. In particular, the current value on the read bit line is provided to the switch 400, and an inverted version created by the inverter 402 is provided to the switch 405. In the absence of the evaluate signal being set, these switches decouple the bit line values from the internal lines 410, 415, but as soon as the evaluate signal is asserted, these switches turn on, and accordingly one of the transistors 425, 435 will turn on dependent on the value read from the associated bit cell. The data to be written is also provided to the two transistors 420, 430, and hence again one of the transistors 420, 430 will turn on whilst the other one remains turned off.

Referring to FIG. 2, it will be appreciated that if the write bit line 75 is at a logic one value and the other write bit line 70 is at a logic zero value, then when the write operation has completed this will result in a logic one value being stored at the node 54 and a logic zero value at the node 52. This means that if the write operation has completed, the current contents of the latch should cause the transistor 80 to turn on during the read operation, and hence cause the voltage on the NRBL bit line 90 to discharge towards a logic zero value. In this scenario, transistor 420 will turn on but transistor 425 will not, and similarly transistor 430 will not turn on whilst transistor 435 does turn on. Accordingly, it will be appreciated that in the event that the read data matches the write data, the comparison block formed by the transistors 420, 425, 430, 435 will not discharge the signal line 450. However, if the values do not match, one of the two paths formed by transistors 420, 425 or 430, 435 will turn on, causing the signal line 450 to be discharged.

Following the end of the evaluation phase, the transistors 440, 445 will turn on to discharge both of the internal lines 410, 415, thereby turning off both of transistors 425 and 435, and allowing the signal line to be precharged via the transistor 455.

For every addressed memory cell, there will be a corresponding comparison block coupled to the same signal line 450. Accordingly, it will be understood that wherever any one or more of the addressed memory cells does not yet store the correct write data, the signal line 450 will be discharged, and only if all of the addressed memory cells store data which matches the write data will the signal line remain at the precharged level. At the end of the evaluate stage, the evaluation block 460 is clocked, and accordingly outputs as the write done signal the current value on the signal line 450. Accordingly, it will be understood that the write done signal will only transition to a logic one value if all of the addressed memory cells store data therein which matches the write data.

Figure 6B:
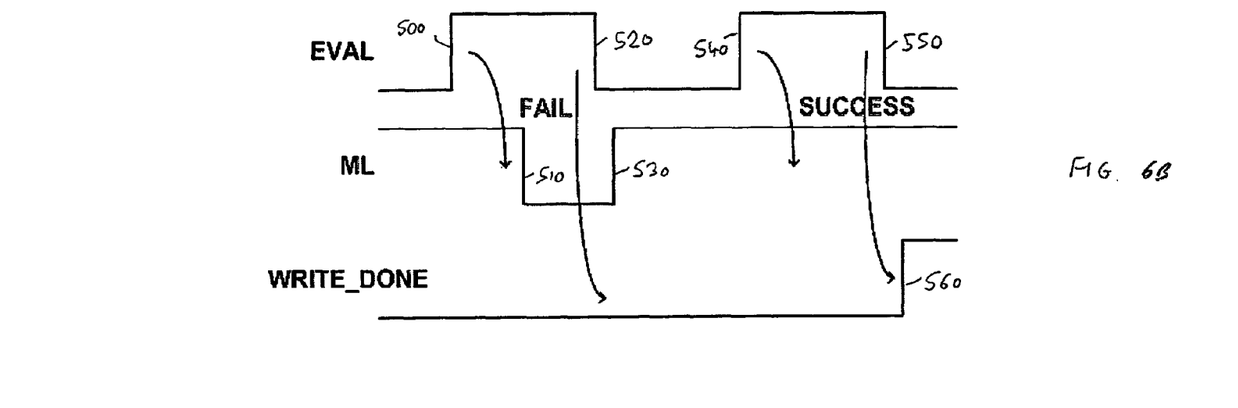
FIG. 6B illustrates the value of various signals within the circuitry of FIG. 6A in accordance with one embodiment.

The operation of the circuitry of FIG. 6A is illustrated schematically by the timing diagram of FIG. 6B. In particular, if during an evaluate stage bounded by the transitions 500, 520, the voltage on the signal line 450 drops, as indicated by the transition 510, then the write done signal output at the end of the evaluate stage will remain at a logic zero level. Following the end of the evaluate stage, the signal line 450 will then be precharged back up to Vdd, as indicated by the transition 530. If during a subsequent evaluate phase bounded by the transitions 540, 550, the signal line 450 does not discharge, then this will cause the write done signal to be asserted at the logic one level at transition 560, thereby causing the write word line pulse to be de-asserted and the write operation to end.

Whilst in one embodiment, all of the memory cells in a particular row of the memory array may form the addressed memory cells for a write operation, it will be understood that in alternative embodiments only a subset of the memory cells in a particular row may form the addressed memory cells. In such embodiments, column multiplexer circuitry will be inserted between the memory array and the comparer circuitry 155, to ensure that only the write bit lines and read bit lines associated with the actual addressed memory cells are provided as inputs to the comparer circuitry 155.

In traditional designs where only a subset of the memory cells in a particular row may be addressed during any particular write operation, a half select problem can occur with regards to the other non-addressed memory cells in the row, since during the period of the write operation, those non-addressed memory cells also receive an asserted write word line signal. If the write word line pulse is too long (as can occur in typical prior art approaches where the pulse width has to be set having regard to the worst case cell in the entire memory array), or if the write word line voltage is too high (as could occur when using the earlier-described word line boosting approach), this can give rise to state flipping within one or more of the non-addressed memory cells in the row, thereby leading to incorrect operation of the memory device. However, when using the above described embodiments, where the write word line pulse width is kept as small as possible sufficient to ensure that the addressed memory cells correctly store the write data, the chance of such non-addressed memory cells flipping state is significantly reduced. Accordingly, the techniques of the above described embodiments not only significantly increase performance by reducing the write word line pulse width, but also reduce the half select problem in designs where not all of the memory cells in a particular row are addressed by the write operation.

Although particular embodiments have been described herein, it will be appreciated that the invention is not limited thereto and that many modifications and additions thereto may be made within the scope of the invention. For example, various combinations of the features of the following dependent claims could be made with the features of the independent claims without departing from the scope of the present invention.

We claim:

1. A memory device comprising:
an array of memory cells, each memory cell being configured to support writing and simultaneous reading of that memory cell;
write circuitry configured, during a write operation, to provide write data to a number of addressed memory cells within the array;
word line select circuitry, responsive to a start of the write operation, to assert a write word line signal to enable said number of addressed memory cells to store said write data; and
comparing circuitry configured, during the write operation, to compare said write data with data currently stored in said number of addressed memory cells;
the comparing circuitry being responsive to detecting that said write data matches the data currently stored in said number of addressed memory cells, to assert a control signal to the word line select circuitry to cause the word line select circuitry to de-assert said write word line signal;
whereby a pulse width of the asserted write word line signal is dependent on time taken by the number of addressed memory cells to store said write data.

2. A memory device as claimed in claim 1, wherein, following assertion of the write word line signal by the word line select circuitry, the comparing circuitry implements an iterative comparison operation, each iteration of the comparison operation comprising a read stage where the data currently stored in said number of addressed memory cells is read, followed by an evaluation stage where said write data is compared with the data obtained by the read stage.

3. A memory device as claimed in claim 2, wherein:
during said read stage, voltage on a read bit line associated with each addressed memory cell is monitored in order to determine the data currently stored in that addressed memory cell; and
each iteration of the comparison operation includes a precharge stage prior to said read stage where each read bit line associated with said number of addressed memory cells is precharged to a predetermined voltage level.

4. A memory device as claimed in claim 2, further comprising timeout circuitry which is responsive to the comparing circuitry not asserting the control signal by a predetermined time after the write word line signal was asserted by the word line select circuitry, to terminate the write operation.

5. A memory device as claimed in claim 2, wherein:
if a current iteration of the comparison operation does not result in detection of a match between said write data and the data currently stored in said number of addressed memory cells, the comparison operation is repeated; and
if a current iteration of the comparison operation does result in detection of a match between said write data and the data currently stored in said number of addressed memory cells, the comparing circuitry is configured to assert said control signal.

6. A memory device as claimed in claim 1, wherein:
said number of addressed memory cells comprises a plurality of addressed memory cells, each addressed memory cell being configured during the write operation to store a corresponding bit of a data word forming said write data; and
said comparing circuitry comprises a comparison block associated with each addressed memory cell, and an evaluation block configured to only assert said control signal to the word line select circuitry if each comparison block detects a match between the data bit currently stored in the associated addressed memory cell and the corresponding bit of the data word forming said write data.

7. A memory device as claimed in claim 6, wherein:
the comparing circuitry implements an iterative comparison operation;
the evaluation block is coupled to a signal line which, for each comparison operation, is precharged to a first voltage level;
during each comparison operation, each comparison block is arranged, once the signal line has been precharged, to alter the voltage on said signal line if a match is not detected between the data bit currently stored in the associated addressed memory cell and the corresponding bit of the data word forming said write data;
whereafter the evaluation block asserts the control signal if the voltage on the signal line has not been altered.

8. A memory device as claimed in claim 7, wherein if the voltage on the signal line has been altered during the comparison operation, the comparing circuitry is arranged to repeat the comparison operation.

9. A method of controlling a write operation within a memory device having an array of memory cells, each memory cell being configured to support writing and simultaneous reading of that memory cell, the method comprising:
during a write operation, providing write data to a number of addressed memory cells within the array;
responsive to a start of the write operation, asserting a write word line signal to enable said number of addressed memory cells to store said write data;
during the write operation, comparing said write data with data currently stored in said number of addressed memory cells; and
responsive to detecting that said write data matches the data currently stored in said number of addressed memory cells, asserting a control signal to cause said write word line signal to be de-asserted;
whereby a pulse width of the asserted write word line signal is dependent on time taken by the number of addressed memory cells to store said write data.

10. A memory device comprising:
an array of memory cell means, each memory cell means for supporting writing and simultaneous reading of that memory cell means;
write means for providing, during a write operation, write data to a number of addressed memory cell means within the array;
word line select means for asserting a write word line signal in response to a start of the write operation, the write word line signal enabling said number of addressed memory cell means to store said write data; and
comparing means for comparing, during the write operation, said write data with data currently stored in said number of addressed memory cell means;
the comparing means, in response to detecting that said write data matches the data currently stored in said number of addressed memory cell means, for asserting a control signal to the word line select means to cause the word line select means to de-assert said write word line signal;
whereby a pulse width of the asserted write word line signal is dependent on time taken by the number of addressed memory cell means to store said write data.

* * * * *